(12) United States Patent
Pascucci

(10) Patent No.: US 6,275,416 B1
(45) Date of Patent: Aug. 14, 2001

(54) PULSE GENERATOR CIRCUIT, PARTICULARLY FOR NON-VOLATILE MEMORIES

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/472,496

(22) Filed: Dec. 27, 1999

(51) Int. Cl.[7] ................................................ G11C 16/04
(52) U.S. Cl. .................... 365/185.19; 365/236; 365/233; 365/191; 365/327; 365/18; 365/21
(58) Field of Search .............................. 365/185.19, 236, 365/233, 191; 327/18, 21

(56) References Cited

U.S. PATENT DOCUMENTS 5,717,642 * 2/1998 Pascucci et al. ...................... 365/191
5,859,810 * 1/1999 Pascucci .......................... 365/230.01
5,959,935 * 9/1999 Pascucci ................................ 365/233

* cited by examiner

Primary Examiner—David Nelms
Assistant Examiner—Connie C. Yoha
(74) Attorney, Agent, or Firm—Jenkens & Gilchrist, P.C.

(57) ABSTRACT

A pulse generator circuit for non-volatile memories, is disclosed, including a circuit for determining the instant at which a pulse for incrementing a counter of the memory is generated and generating an increment pulse duration start signal; a circuit for determining the minimum amplitude of the increment pulse and generating an increment pulse duration end signal; a first logic circuit for enabling the generation of the increment pulse based upon the increment pulse duration start and end signals; and an increment pulse generation circuit for generating or suppressing the increment pulse of the counter of the memory, based upon the current condition of the memory.

30 Claims, 2 Drawing Sheets

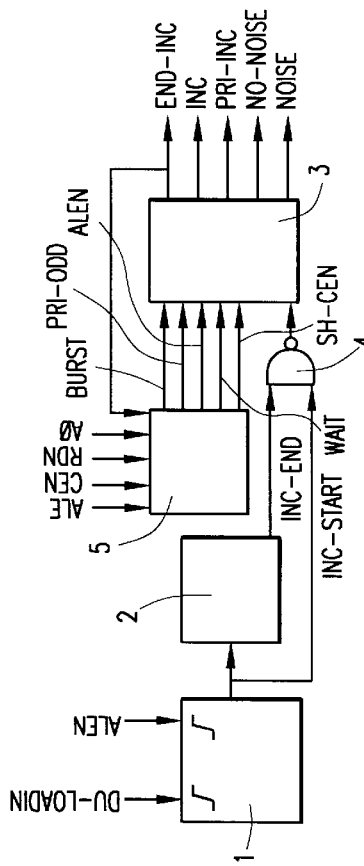
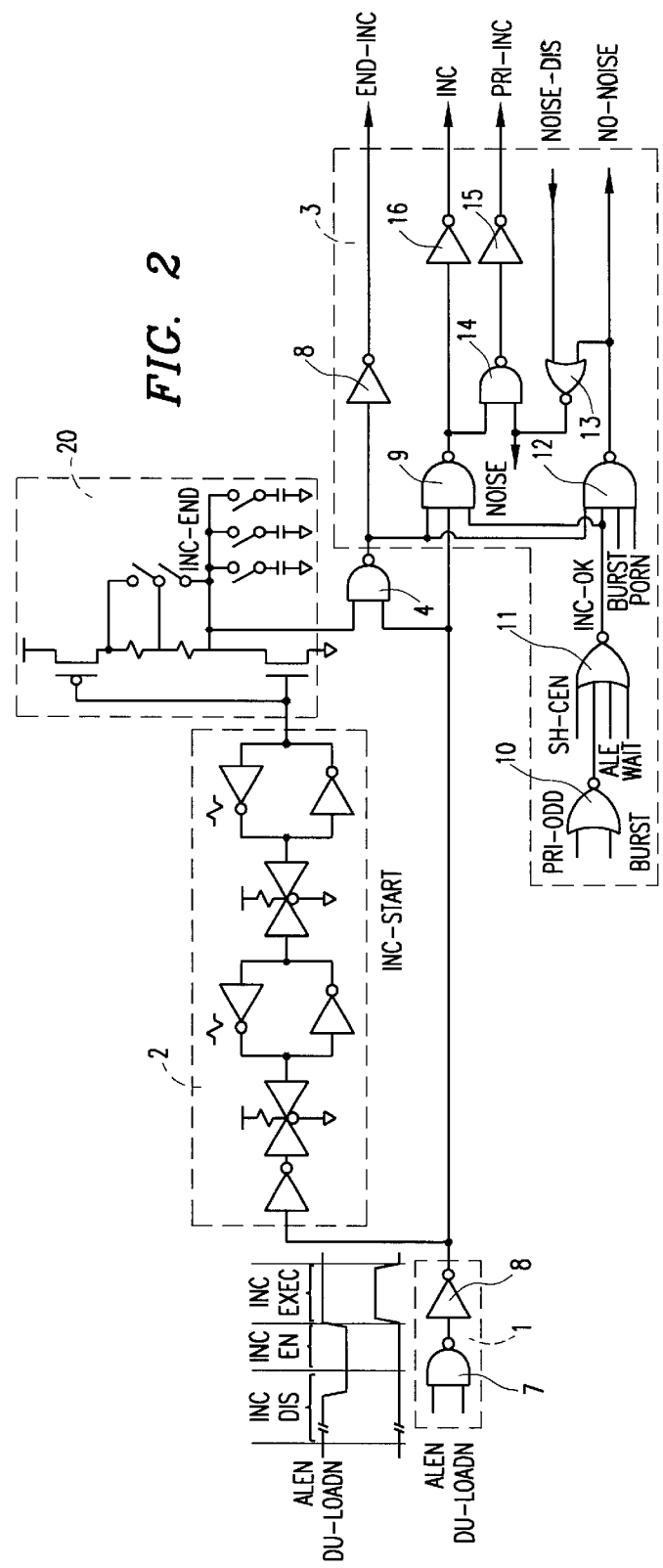
FIG. 1
FIG. 2

PULSE GENERATOR CIRCUIT, PARTICULARLY FOR NON-VOLATILE MEMORIES

BACKGROUND OF THE INVENTION

The present invention relate to a pulse generator circuit, particularly for non-volatile memories.

More particularly, the invention relates to a circuit for generating mutually correlated pulses which are suitable to stimulate a plurality of internal units in a non-volatile memory.

Generally, the cells of a conventional non-volatile memory are organized in a single array, and in the normal operating mode they are read by pointing to the external address that directly points to one of the cells of the memory array.

This kind of memory organization does not require particular synchronization activities internally.

However, when additional circuits, such as a counter in order to perform a plurality of sequential read operations, are introduced in order to improve the memory and provide faster operation thereof, a problem arises in synchronizing the propagation of a normal memory read stream and the occurrence of an address change, which can be triggered both internally (in the case of an increment of the counter of the memory) and externally (pointing to a random location, as occurs in the execution of a "skip" operation).

In addition to updating the new reading path, there can be other internal activities, such as preventative measures against the effects of buffer transitions (i.e., against the noise that can be generated) and feedback to the timing circuit of the memory in order to determine the end of pulses to be implemented.

In some embodiments, such as for example the memories organized in the so-called interleaved mode, the memory cells are arranged in two separate memory banks, each with its own counter.

In this last type of memory there is also another problem which is due to the fact of having to decide which of the two counters of the two banks is to be incremented, when to begin the increment, and also perform any suspension of the increment updates.

It is therefore evident that it is necessary to synchronize the various parts of the memory.

Moreover, in order to achieve the best possible performance, some of these synchronization pulses must have minimal duty cycle characteristics.

Although the duty cycle must be minimal, it must nonetheless ensure the correct generation of the pulse and its correct use.

The pulse generator circuits currently used in memories do not perform this function of generating pulses of minimal duration with the assurance of full functionality and therefore they are not suitable when one wishes to obtain high performance from a memory.

SUMMARY OF THE INVENTION

The aim of the present invention is to provide a pulse generator circuit, particularly for non-volatile memories, which allows to generate pulses whose duration is minimal but nonetheless sufficient to ensure correct utilization of the pulse.

Within the scope of this aim, an object of the present invention is to provide a pulse generator circuit, particularly for non-volatile memories, which allows to update an internal counter of the memory.

Another object of the present invention is to provide a pulse generator circuit, particularly for non-volatile memories, which allows to generate pulses which are suitable to synchronize a series of activities of the memory.

Another object of the present invention is to provide a pulse generator circuit, particularly for non-volatile memories, which allows to produce such pulses according to the rules of a protocol of the interleaved type.

Another object of the present invention is to provide a pulse generator circuit, particularly for non-volatile memories, which is suitable for deriving a plurality of pulses and signals for the synchronization of further parts of the memory.

Another object of the present invention is to provide a pulse generator circuit, particularly for non-volatile memories, which allows interaction with the timing circuit of the memory.

Another object of the present invention is to provide a pulse generator circuit, particularly for non-volatile memories, which is highly reliable, relatively easy to manufacture and at competitive costs.

This aim, these objects and others which will become apparent hereinafter are achieved by a pulse generator circuit, particularly for non-volatile memories, characterized in that it comprises:

means for determining the instant at which a pulse for incrementing a counter of the memory is generated, said means being adapted to generate a generation start signal;

means for determining a minimum amplitude of said increment pulse which are connected to the output of said means for determining the instant at which the increment pulse is generated and are adapted to generate an increment pulse duration end signal;

first logic means for enabling the generation of said increment pulse which receive in input said increment pulse duration start and end signals; and pulse generation means which are cascade-connected to said pulse generation enable logic means and are adapted to generate or suppress said increment pulse of the counter of the memory, also as a function of control signals received from timing means, said control signals being correlated to the current condition of said memory.

BRIEF DESCRIPTION OF THE DRAWINGS

Further characteristics and advantages of the present invention will become apparent from the description of a preferred but not exclusive embodiment of the pulse generator circuit according to the invention, illustrated only by way of non-limitative example in the accompanying drawings, wherein:

FIG. 1 is a block diagram of the pulse generator circuit according to the present invention;

FIG. 2 is a circuit diagram of the pulse generator circuit according to the invention.

DESCRIPTION OF THE PREFERRED EMBODIMENTS

Figure 3:
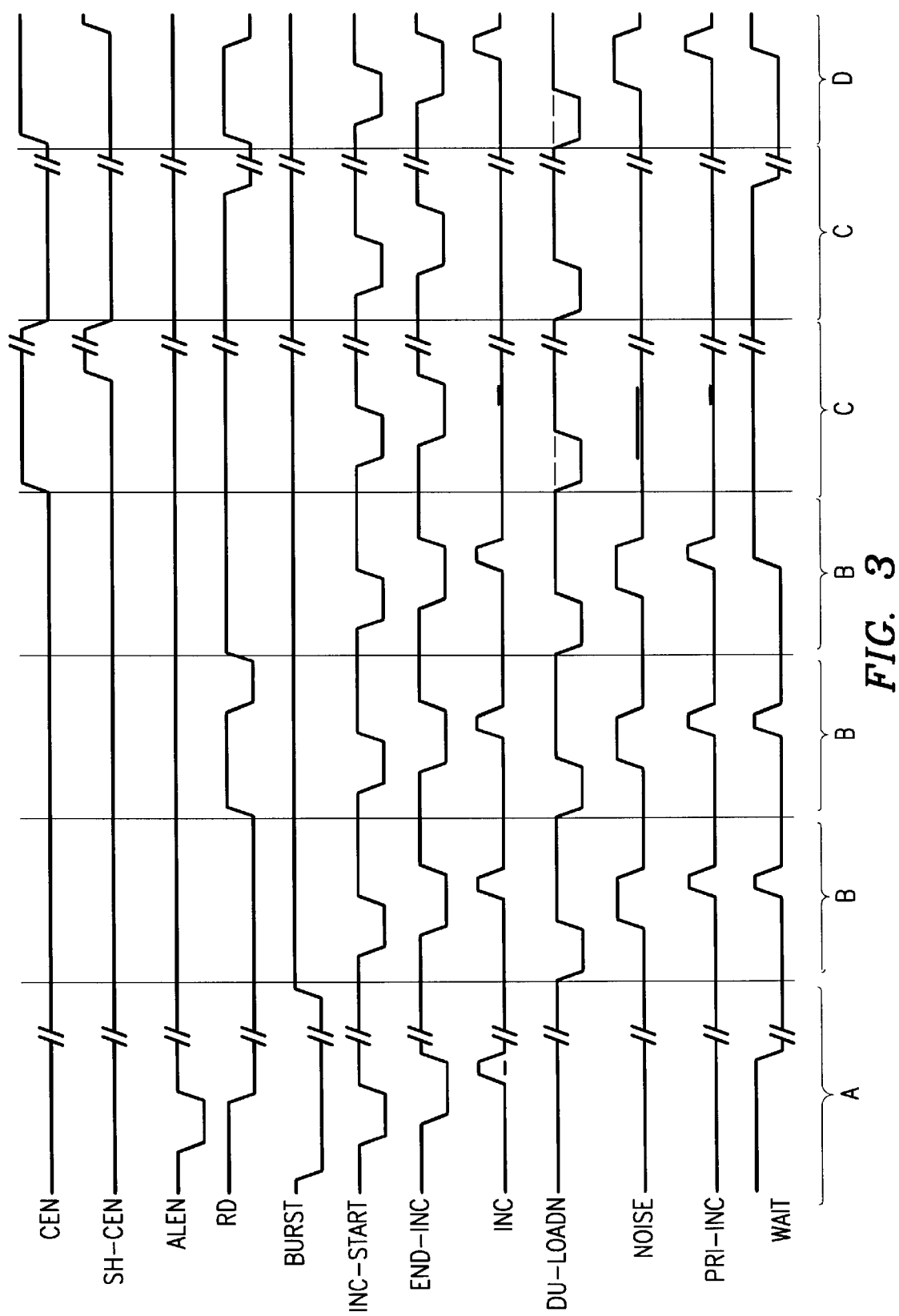
FIG. 3 is a chart of the timing of the various signals involved in the pulse generator circuit according to the present invention.

With reference to the above figures, in which identical reference numerals designate identical elements, and particularly with reference to FIG. 1, the pulse generator circuit according to the present invention comprises means 1 for determining the instant when the intended pulse is generated which are connected to means 2 for determining the amplitude of such pulse which are adapted to drive, together with the means 1 for determining the pulse generation instant, pulse management means 3 which are adapted not only to allow generation of the pulse, hereinafter designated by INC, but also to generate a plurality of additional signals which allow to synchronize different activities of the memory.

In particular, again with reference to FIG. 1, the pulse generation instant determining means 1 emit a signal, designated by INC-START, while the pulse amplitude determination means 2 emit a signal designated by INC-END. The two signals INC-END and INC-START are input to logic means 4, conveniently constituted for example by a NAND gate, whose output is a signal which drives the means 3 for generating (managing) the pulse INC.

FIG. 1 illustrates the presence of timing means 5, which are adapted to generate signals for driving the pulse generation means 3 and receive feedback from them.

The timing means 5 are not shown in the circuit diagram of FIG. 2 and receive in input a plurality of signals, including:

ALE: address latch enable signal;

CEN: chip enable negated signal;

RDN: read negated signal.

The timing means 5 further emit in output a plurality of signals, including:

PRI-ODD: a signal which indicates that the current activities are prioritized for the odd memory bank;

BURST: a signal which indicates that sequential reading of the memory can occur and that pulse generation can be enabled;

ALEN: address latch enable negated signal;

SH-CEN: time-shifted and negated chip disable signal; and

WAIT: signal for temporarily suspending the pulses, allowing synchronization with the external clock according to the interleaved protocol.

The means 1 for determining the instant of generation of the pulse INC receive in input a signal for stimulating the generation of the pulses, DU-LOADN, and the signal ALEN, which is generated, as mentioned, by the timing means 5.

In particular, the signal DU-LOADN stimulates read pulses at each read cycle end which ends with the loading pulse DU-LOADN.

The means 3 for generating the pulse INC instead emit in output, in addition to the pulse INC, the following signals:

END-INC: INC pulse end signal, which is fed back to the timing means 5 and indicates that increment activities are in progress; it allows to synchronize the activities of the timing of the memory;

PRI-INC: priority pointer update pulse signal which controls the activities of the two memory banks;

NOISE: a signal for indicating a "noisy" interval due to transition on the outputs of the memory;

NO-NOISE: signal for suppressing the NOISE pulse.

At this point it is necessary to make a brief preamble and illustrate the meaning of the INC pulse which is used to increment the counters of the memory banks.

In practice, the pulse INC, together with signals which indicate the odd bank counter and the even bank counter, is sent to logic means which are adapted to provide in output a signal for incrementing the even memory bank counter and a signal for incrementing the odd memory bank counter.

The even and odd counters of the even and odd memory banks, respectively, in turn emit a set of address signals which are meant to allow to read the respective memory bank.

Therefore, the increment pulse INC is used to generate increment pulses which are dedicated respectively to the counter of the even memory bank and to the odd memory bank counter.

The signal PRI-INC instead updates the current activities, assigning them alternately to one memory bank or the other at the end of each read cycle.

With reference now in detail to FIG. 2, which illustrates the circuit diagram of the pulse generation circuit shown in FIG. 1, the pulse generation instant determining means 1 are conveniently constituted by a NAND gate 7, which receives in input the signal ALEN and the signal DU-LOADN, and whose output is fed to an inverter 8, which emits the INC-START pulse generation start signal, which is sent to the pulse generation means 3 and to the pulse amplitude determining means 2.

The means 2 are conveniently constituted by two stages, master and slave, which replicate a counting structure so as to replicate the propagation times of a counter stage.

In particular, the means 2 comprise stages which replicate (with dedicated circuit structures) the rising transition time and the falling transition time of a counter stage, replicating both the circuit and its dimensions.

The means 2 for determining the amplitude of the pulse INC emit in output a signal INC-END, which is sent to the NAND gate 4 together with the signal INC-START.

The NAND gate 4 generates the END-INC signal after its output has passed through an inverter 8 which is part of the pulse generation means 3.

In detail, the pulse generation means 3 generate the increment signal INC by means of a first NAND logic gate 9 thereof, which receives in input the signal in output from the NAND logic gate 4, the INC-START signal, and an increment enable signal INC-OK generated in a further section of the pulse generation means 3.

The generation of the INC-OK signal and the events leading to its generation are now described.

The signal PRI-ODD and the signal BURST are input to a NOR gate 10 (whose task is to identify the two conditions of current address equal to ODD and of activity in BURST mode), to which an additional NOR gate 11 is cascade-connected; said NOR gate 11 receives in input the signal in output from the NOR gate 10, in addition to the signals SH-CEN, ALE and WAIT (all of which prevent pulse increment), in order to output the signal INC-OK (the NOR gate 11 collects the pulse blocking conditions), which is sent in input to the NAND gate 9, and to a second NAND gate 12 (the NAND gate 12 collects the NOISE signal suppression conditions) of the pulse generation means 3, which further receives in input the signal in output from the NAND gate 4 which identifies the pulse condition, and the signals BURST and PORN (Power On Reset negated). The NAND gate 12 emits in output the signal NO-NOISE, which is sent in input to a NOR gate 13 which receives, on its other input, a signal NOISE-DIS for disabling the noise signal.

The NOR gate 13 emits in output the signal NOISE, which is further input to a third NAND gate 14, which receives as its other input the output of the NAND gate 9, in order to generate the signal PRI-INC with an inverter 15 interposed.

An inverter 16 is also provided in output to the NAND gate 9 in order to generate the signal INC.

The pulse amplitude determining means 2 are further connected to means 20 for determining a correction to be applied to the width of the pulse determined by the means 2.

Such means therefore perform a trimming operation on the signal INC-END which is produced by the pulse amplitude determining means 2.

As mentioned, the circuit diagram of FIG. 2 does not illustrate the timing means 5 shown in block form in FIG. 1.

The operation of the circuit according to the invention is now described with reference to FIG. 3, which is a timing chart of the various signals involved in the pulse generator circuit according to the invention.

After the low-to-high transition of one of the signals ALEN (which identifies the "first increment" condition) and DU-LOADn (which identifies the increment condition), the signal INC-START is generated, allowing to generate the increment pulse INC, and is sent to the pulse generation means 3 and to the means 2 for determining the duration of the pulse INC.

When the signal INC-START is at the high level, it is input, together with the signal INC-END at high level, to the NAND gate 4, which generates in output the increment step end signal END-INC which is fed back to the timing means 5, as shown in FIG. 1.

The pulse generation means 3 are further driven not only by the signal INC-START but also by the signals PRI-ODD and BURST, which are input to the NOR gate 10. If the signal PRI-ODD is low, i.e., the counter of the odd memory bank is not to be incremented (according to the interleaved protocol), then the signal INC-OK, generated by the NOR logic gate 11, is low, and the pulse generation means 3 suppress any pulse INC, since the low signal (INC-OK=0) is input to the NAND logic gate 9, which maintains a low signal at the output.

The signals SH-CEN, ALE and WAIT are all the control signals that can prevent (in the standby condition, in the external forced addressing condition and in the protocol synchronization condition, respectively) the generation of the signal INC-OK which then leads to the generation of the signal INC.

As shown in FIGS. 2 and 3, if the signal ALEN or the signal DU-LOADN do not transition from low to high, the signal INC is not generated. However, there are conditions in which the increment signal INC is not generated even in the presence of stimuli. Accordingly, although the signal ALEN switches from zero to one, when an EVEN (ODD=0) start address is captured the increment does not occur because INC-OK is forced to zero by the NOR gate 10 because PRI-ODD and BURST are both simultaneously equal to zero.

Likewise, since the signal WAIT is always set to 1 at the end of each complete read cycle and removed only if then RDn=0, the increment signal INC is suspended until this condition occurs. Accordingly, if the memory enters the standby condition without the WAIT signal being removed, then no increment signal INC, even if stimulated, can be produced. In this case, in the absence of the signal INC, the signal NOISE too is low.

As clearly shown, the generation of the INC pulse is driven by the signal INC-START, whose rise determines the instant at which the signal INC is generated, and by the END-INC signal, whose rise determines the falling front of the signal INC.

In FIG. 3, the vertical lines that cross the timing signals transversely divide the chart of FIG. 3 into a plurality of sections, designated by the letters A, B, C and D.

Such sections correspond to sections in which the signal INC is present or absent. In the section A, the signal INC is generated following a low-to-high switching of the signal ALEN, because an ODD start address has been assumed, whereas in the sections B the signal INC is generated by a low-to-high switching of the signal DU-LOADN following a rising front of the signal RD.

In the sections C, the signal INC is instead suppressed, because the signal RD remains high, without any rising front which has entailed the forcing of the WAIT signal to a high level; finally, in the section D the signal INC is recovered due to the low level of the signal RD. With this prerogative, the memory does not lose the last read data item but indeed continues the increment of the counter starting from the last read data item, even if it was previously in a wait situation.

The waveforms of the signals ALEN and DU-LOADN shown at the means 1 for determining the instant of generation of the pulse INC, in FIG. 2, in fact show that the pulse INC is generated exclusively following a low-to-high switching of one of the two signals ALEN and DU-LOADN. In said chart of FIG. 2, the portion designated by INC-DIS indicates the disabling of the increment pulse INC, the portion designated by INC-EN indicates the step for enabling the pulse INC, and the portion designated by INC-EXEC indicates the step for the actual generation of the pulse INC.

In practice it has been observed that the pulse generator circuit particularly for non-volatile memories according to the invention achieves the intended aim and objects, since it allows to generate synchronously, flexibly and with a minimal duration the increment signal INC and a series of control signals which are indispensable for providing a reading protocol of the interleaved type.

Therefore, the updating of a counter for addresses of a memory is performed in the shortest possible times which are however sufficient to ensure the correct operation of the counter and at the same time maximize its performance.

The update pulses are furthermore stimulated at the end of a step for loading the initial addresses from outside the memory and directly at the end of each complete reading cycle.

The circuit thus conceived is susceptible of numerous modifications and variations, all of which are within the scope of the inventive concept; all the details may further be replaced with other technically equivalent elements.

What is claimed is:

1. A pulse generator circuit, particularly for non-volatile memories, comprising:

means for determining the instant at which a pulse for incrementing a counter of the memory is generated, said means being adapted to generate an increment Pulse duration start signal;

means for determining a minimum amplitude of said increment pulse which are connected to the output of said means for determining the instant at which the increment pulse is generated and are adapted to generate an increment pulse duration end signal;

first logic means for enabling the generation of said increment pulse which receive in input said increment pulse duration start and increment pulse duration end signals;

timing means for generating one or more control signal; and increment pulse generation means which are cascade-connected to said first logic means and are adapted to selectively generate said increment pulse of at least one address counter of the memory as a function of the one or more control signals received from said timing means, said control signals being correlated to the current condition of said memory.

2. The circuit according to claim 1, wherein said means for determining the instant of generation of said increment pulse are driven by a transition of said one or more control signals generated by said timing means, at least one of said control signals being a memory address latch enable signal.

3. The circuit according to claim 1, wherein said means for determining the amplitude of said increment pulse comprise a master-slave delay path structure for replicating the propagation times of the rising and falling transitions of the at least one address counter.

4. The circuit according to claim 1, further comprising means for adjusting said amplitude, wherein an output of said means for determining the minimum amplitude of said increment pulse is connected to an input of said means for adjusting said minimum amplitude, said means for adjusting generates said increment pulse duration end signal.

5. The circuit according to claim 4, wherein said increment pulse generation means comprise:

second logic means for enabling the generation of said increment pulse, which are suitable to allow enabling if the at least one address counter of the memory for which said increment pulse is intended is the counter that is to be incremented; and third logic means for enabling the generation of said increment pulse, which are driven by said one or more control signals generated by said timing means, are cascade-connected to said second logic means and generate a signal for enabling the generation of said increment pulse.

6. The circuit according to claim 5, wherein said increment pulse generation means comprise fourth logic means for generating said increment signal which receive in input said increment pulse generation start signal, said increment pulse generation enable signal, and an increment step end signal, generated by said first logic means.

7. The circuit according to claim 6, further comprising additional logic means which are cascade-connected to said third logic enable means which are adapted to generate a signal for indicating the presence of output transitions of said memory.

8. A method for generating increment pulses, particularly for non-volatile memories, comprising the steps of:

determining an instant in which the generation of an increment pulse begins, said instant being closely correlated to the read cycle of the memory;

determining a minimum allowed duration of said increment pulse;

generating said increment pulse following the occurrence of enable conditions, according to a protocol of said memory, to increment at least one address counter for which said increment signal is intended and by which address values are generated.

9. The method according to claim 8, wherein said determining the minimum allowed duration of said increment pulse includes replicating the propagation times of the at least one address counter as regards the rising and falling transitions thereof.

10. The method according to claim 8, comprising, after said determining the minimum allowed duration of said increment pulse, performing an adjustment of said minimum allowed duration.

11. The method according to claim 8, comprising the step of generating, following the generation of said increment signal, a signal for notifying the transition of the outputs of said memory.

12. The method according to claim 11, comprising the step of generating, following the generation of said increment signal, a pulsed update signal for a circuit for generating a priority handling signal for handling the priority of read processes of a non-volatile memory divided into two separate banks and including two address counters, said priority handling signal being also adapted to determine which of the address counters that belong to said two separate memory banks is to be incremented.

13. The circuit according to claim 1, wherein the means for determining the instant, the means for determining a minimum amplitude, the first logic means and the increment pulse generation means comprise asynchronous circuitry.

14. The circuit according to claim 1, wherein the means for determining the instant generates the increment pulse duration start signal responsive to an address latch enable signal.

15. The circuit according to claim 4, wherein the means for adjusting said amplitude includes at least one trimmable/trimmed circuit element.

16. The circuit according to claim 1, wherein the increment pulse is a self-timed signal.

17. The method according to claim 8, further comprising setting a delay adjustment amount of the minimum allowed duration of the increment pulse.

18. Timing circuitry for controlling at least one address counter of a random access memory device, comprising:

a first circuit for receiving at least one control signal and generating a pulse signal based upon the at least one control signal, the first circuit being a self-timed circuit; and a second circuit for receiving the pulse signal, selectively suppressing the pulse signal based upon a present condition of the random access memory device, and applying the pulse signal to a clock input of the at least one address counter.

19. The timing circuitry according to claim 18, wherein the first circuit comprises a one-shot circuit.

20. The timing circuitry according to claim 18, wherein the at least one control signal received by the first circuit is an address latch enable signal.

21. The timing circuitry according to claim 18, wherein the first circuit includes at least one component for selectively adjusting a duration of the pulse signal.

22. The timing circuitry according to claim 18, wherein the second circuit suppresses the pulse signal if the random access memory device is in a standby condition.

23. The timing circuitry according to claim 18, wherein the first and second circuits are asynchronous circuits.

24. The timing circuitry according to claim 18, wherein the second circuit generates at least one control output signal for use in incrementing a first address counter by the pulse signal and a second address counter by the pulse signal, each of the first and second address counters providing address values to distinct memory banks in the random access memory device.

25. The timing circuit of claim 18, wherein the first circuit includes delay circuitry having a propagation delay corresponding to a delay associated with the at least one address counter.

26. A method of clocking at least one address counter of a random access memory device, comprising:
   receiving at least one control signal during a memory access operation and generating a pulse signal responsive to the at least one control signal and having a predetermined pulse duration;
   selectively suppressing the pulse signal based upon a present condition of the random access memory device; and
   applying the pulse signal to the at least one address counter.

27. The method of claim 26, wherein the at least one control signal is an address latch enable signal.

28. The method of claim 26, further comprising selecting the predetermined pulse duration.

29. The method of claim 26, wherein the predetermined pulse duration includes a delay corresponding to the at least one address counter.

30. The method of claim 26, further comprising generating an output control signal for use in incrementing a first address counter with the pulse signal, and incrementing a second address counter with the pulse signal.

* * * * *